US008324134B2

(12) United States Patent
Saito et al.

(10) Patent No.: US 8,324,134 B2
(45) Date of Patent: Dec. 4, 2012

(54) METHOD OF MANUFACTURING SUPERCONDUCTING RADIO-FREQUENCY ACCELERATION CAVITY

(75) Inventors: Kenji Saito, Tsukuba (JP); Koichi Takeuchi, Koto-ku (JP); Hiroshi Yamazaki, Osaka (JP)

(73) Assignees: Inter-University Research Institute Corporation High Energy Accelerator Research Organization, Tsukuba-Shi (JP); Tokyo Denkai Co., Ltd., Tokyo (JP); TKX Corporation, Osaka-Shi (JP)

( * ) Notice: Subject to any disclaimer, the term of this patent is extended or adjusted under 35 U.S.C. 154(b) by 0 days.

(21) Appl. No.: 12/737,651

(22) PCT Filed: Jun. 24, 2009

(86) PCT No.: PCT/JP2009/061489
§ 371 (c)(1), (2), (4) Date: Feb. 3, 2011

(87) PCT Pub. No.: WO2010/016337
PCT Pub. Date: Feb. 11, 2010

(65) Prior Publication Data

US 2011/0130294 A1 Jun. 2, 2011

(30) Foreign Application Priority Data

Aug. 7, 2008 (JP) ................................ 2008-204318

(51) Int. Cl.
*H01L 39/24* (2006.01)

(52) U.S. Cl. ......................................... 505/401; 148/96

(58) Field of Classification Search .................. 505/401, 505/410, 325; 148/96–98, 668; 29/599
See application file for complete search history.

(56) References Cited

U.S. PATENT DOCUMENTS

| | | | | |
|---|---|---|---|---|
| 3,805,119 | A * | 4/1974 | Koch et al. | 361/141 |
| 3,902,975 | A * | 9/1975 | Martens | 205/95 |
| 4,612,040 | A * | 9/1986 | Koizumi et al. | 75/10.65 |
| 5,099,820 | A * | 3/1992 | Stricot | 125/16.01 |
| 5,230,382 | A * | 7/1993 | Swars | 164/477 |
| 5,817,711 | A * | 10/1998 | Kambe et al. | 524/501 |
| 6,097,153 | A * | 8/2000 | Brawley et al. | 315/5.41 |
| 6,221,814 | B1 * | 4/2001 | Kaburagi et al. | 508/136 |
| 6,352,927 | B2 * | 3/2002 | Kishimoto | 438/690 |
| 7,211,141 | B2 * | 5/2007 | Kobayashi | 117/19 |
| 7,391,850 | B2 * | 6/2008 | Kaertner et al. | 378/118 |
| 7,461,648 | B2 * | 12/2008 | Hukin | 125/16.02 |
| 7,666,243 | B2 * | 2/2010 | Aimone et al. | 75/10.23 |
| 8,065,995 | B2 * | 11/2011 | Bakshi et al. | 125/21 |

(Continued)

FOREIGN PATENT DOCUMENTS

JP 2003-332183 11/2003

(Continued)

*Primary Examiner* — Colleen Dunn
(74) *Attorney, Agent, or Firm* — Manabu Kanesaka

(57) ABSTRACT

To provide a manufacturing method of a superconducting radio-frequency acceleration cavity used in a charged particle accelerator enabling the manufacturing with few waste amounts of the niobium material at low cost in a short time, the manufacturing method has each of the steps of (a) obtaining an ingot made from a disk-shaped niobium material, (b) slicing and cutting the niobium ingot into a plurality of niobium plates each with a predetermined thickness, by vibrating multiple wires back and forth while spraying fine floating abrasive grains with the niobium ingot supported, (c) removing the floating abrasive grains adhered to the sliced niobium plates, and (d) performing deep draw forming on the niobium plates and thereby obtaining a niobium cell of a desired shape.

12 Claims, 9 Drawing Sheets

U.S. PATENT DOCUMENTS

2006/0086438 A1* 4/2006 Aimone et al. ............... 148/557
2006/0251217 A1* 11/2006 Kaertner et al. .............. 378/119
2007/0044873 A1* 3/2007 Aimone ........................ 148/557
2008/0020225 A1* 1/2008 Saito et al. .................... 428/573
2010/0066273 A1* 3/2010 Saito et al. .................... 315/500
2010/0126490 A1* 5/2010 Bakshi et al. ................... 125/21

FOREIGN PATENT DOCUMENTS

JP 2004-027358 1/2004
JP 2004-082283 3/2004
JP 2004-106360 4/2004
WO WO 2006/129602 A1 * 12/2006

* cited by examiner

METHOD OF MANUFACTURING SUPERCONDUCTING RADIO-FREQUENCY ACCELERATION CAVITY

RELATED APPLICATIONS

The present application is National Phase of International Application No. PCT/JP2009/061489 filed Jun. 24, 2009, and claims priorities from, Japanese Application No. 2008-204318 filed Aug. 7, 2008, the disclosure of which are hereby incorporated by reference herein in its entirety.

TECHNICAL FIELD

The present invention relates to a radio-frequency acceleration cavity used in a charged particle accelerator such as a synchrotron, and more particularly, to a manufacturing method of a superconducting radio-frequency acceleration cavity.

BACKGROUND ART

The radio-frequency acceleration cavity is a cavity made of metal devised to resonate a radio-frequency wave of a particular frequency so as to accelerate charged particles with efficiency by using the radio-frequency electric field, and is used in a charged particle accelerator such as a synchrotron.

For the radiofrequency cavity, since generation of the radio-frequency wave produces heat, metal materials are suitable that are high in thermal conductivity and low in electric resistance. Conventionally, copper has been used as raw materials of such a radio-frequency acceleration cavity. However, since the calorific value increases as the acceleration electric field increases, radio-frequency acceleration cavities made of copper materials have limitations in improvements in performance. Therefore, in recent years, superconducting cavities have been proposed and used. Then, niobium materials (in the present invention, the "niobium materials" include niobium alone and alloys of niobium and another metal (for example, copper)) are used because niobium causes superconducting transition at the highest absolute temperature as an elemental metal and has the advantage of being relatively ease to process as a metal, and currently, the radio-frequency acceleration cavity made of niobium materials is being put into practical use.

FIG. 9 is to explain the principle of accelerating the velocity of a charged particle in the radio-frequency acceleration cavity. In the case of assuming that the length of a pipe is d, in the radio-frequency wave the frequency is f, the wavelength is $\lambda$, and the cycle is T, and the velocity of a charged particle is v, when time $t=d/v$ required to pass through a single pipe is a half of the cycle T, the charged particle is accelerated in each of coupled pipes. Herein, since $v=f\lambda$ and $T/2=t=d/v=d/f\lambda=dT/\lambda$, the length of a single pipe is designed so that $d=\lambda/2$. By this means, whenever the number of pipes to couple is increased, the charged particle obtains energy from each pipe, and it is thereby possible to accelerate the velocity of the charged particle cumulatively.

Niobium is relatively soft ash gray metal (transition metal), and has body-centered cubic lattice structure that is stable crystal structure at room temperature under normal pressure, and the specific gravity of 8.56. In air, the oxide layer is formed and has corrosion resistance and acid resistance. Niobium causes superconducting transition at 9.2K (under normal pressure) that is the highest absolute temperature as an elemental metal.

A large amount of niobium thin plates with thicknesses of the order of several millimeters is required to manufacture a superconducting radio-frequency acceleration cavity made of niobium materials.

In the conventional technique, as a method of obtaining a niobium thin plate with a thickness of the order of several millimeters, there have been a plasticity processing method of cutting a required amount from a high-purity niobium ingot, and then, performing forging and rolling thereon, and a saw method of slicing a niobium ingot with a diameter of a few tens of centimeters using a band saw machine or the like.

SUMMARY OF THE INVENTION

Problems to be Solved by the Invention

However, in the plasticity processing method, since manufacturing processes are complicated and many processes are needed, not only a long time is required for manufacturing, but also the cost is high, because defects occur in the material by containing impurities in the rolling processing, etc. and therefore, a large amount of waste materials is generated. Meanwhile, in the saw method, since the blade thickness of the saw is large, approximately 50% of the material becomes waste materials, and further, since the cut surface is rough, additional surface finish processing is required.

The factors affecting performance in the superconducting radio-frequency cavity are the niobium material and surface treatment technique. As the surface treatment technique, there are chemical polishing and electrolytic polishing. In cavities manufactured from polycrystal niobium materials in the conventional technique, it is known that electrolytic polishing provides more excellent performance than chemical polishing in the problem of surface roughness in the grain boundary and the like. This is considered the problem with the grain boundary of the material. To guarantee in chemical polishing the cavity performance equal to that in electrolytic polishing, the cavity should be manufactured from a huge crystal or single crystal of niobium materials. Chemical polishing has advantages such as easiness in the processing method, and huge crystal/single crystal niobium cavities have been developed in Europe and the United States. In this case are adopted a method of cutting the huge crystal niobium ingot mechanically using a saw blade and another method of slicing on a sheet-by-sheet basis by electrical discharge machining.

In electrolytic polishing, it has been found by experiment that it is possible to ensure the cavity performance irrespective of a huge crystal or single crystal. Further, it has been found that plate materials manufactured from the ingot do not have any serious problems with formability in press processing. Furthermore, in the method, the quality of the material is stabilized, and significant merits are obtained. Therefore, by manufacturing a cavity using plate materials directly prepared from the ingot and performing electrolytic polishing, it is possible to ensure performance irrespective of the gain size of the ingot, while concurrently enabling significant cost reductions in the materials cost.

Means for Solving the Problem

The present invention aims to solve the above-mentioned various problems in the conventional techniques, and provides a method of manufacturing a superconducting radio-frequency acceleration cavity used in a charged particle accelerator characterized by having each of the steps of (a) obtaining an ingot made from a disk-shaped niobium material, (b) slicing and cutting the niobium ingot into a plurality of niobium plates each with a predetermined thickness, by vibrating multiple wires back and forth while spraying fine floating abrasive grains with the niobium ingot supported, (c) removing the floating abrasive grains adhered to the sliced niobium plates, and (d) performing deep draw forming on the niobium plates and thereby forming a niobium cell of a desired shape. Herein, the niobium ingot is niobium alone or alloys with other metals.

In the aforementioned step (a), the disk-shaped niobium ingot is obtained by applying electronic beams to the niobium material in a crucible of a predetermined shape to melt.

Further, the floating abrasive grains are silicon carbide (SiC) mixed into oil, and in the step (b) of slicing and cutting the niobium ingot, the top portion of the niobium ingot is bonded and supported with an epoxy resin.

Then, each of the wires used in the step (b) is a piano wire with a diameter of 0.16 mm, and enables six niobium plates to be obtained when a thickness of the niobium ingot is 20 mm.

Advantageous Effect of the Invention

In the manufacturing method of a superconducting radio-frequency acceleration cavity of the invention, the required niobium-disk-shaped niobium ingot is sliced using piano wires and abrasive grains, and it is thereby possible to significantly reduce waste materials of the material. In the manufacturing method, it is possible to eliminate all of the other processes such as forging, rolling and annealing, the processing processes are thereby remarkably simplified, and concurrently with increases in productivity, significant cost reductions are achieved.

DESCRIPTION OF EMBODIMENTS

An Embodiment of the invention will specifically be described below with reference to drawings.

1. Background

It was clarified that electrolytic polishing (EP) holds superiority over chemical polishing (CP) in high electric field properties of the superconducting radio-frequency cavity. Subsequently, by further testing in many institutes and laboratories, this fact was confirmed in the superconducting cavity fabricated from polycrystal niobium material plates. It is expected that this problem is associated with grain boundaries of the niobium material, and a plurality of research facilities has started development of superconducting cavities of huge crystal niobium/single crystal niobium, and yielded remarkably promising results.

At present, it is obvious that high electric field properties are obtained in the single crystal niobium cavity, and in recent years, studies and reports have been made such as technical studies on the manufacturing method of the single crystal niobium ingot, performance reports on the huge crystal niobium cavity, and studies on materials cost reductions by huge crystal niobium. As a result of such studies, the single crystal niobium ingot has not reached active promotion from high development costs and long development period, but it became obvious that ingot slicing techniques are a key to cost reductions.

The International Linear Collider (ILC) requires 17,000 L-band 9-cell superconducting cavities, and required niobium materials reach 310,000 sheets only for cell materials. The required rate of production is the order of 420 sheets a day. It is important to improve materials production efficiency and enhance materials yield.

Figure 1:
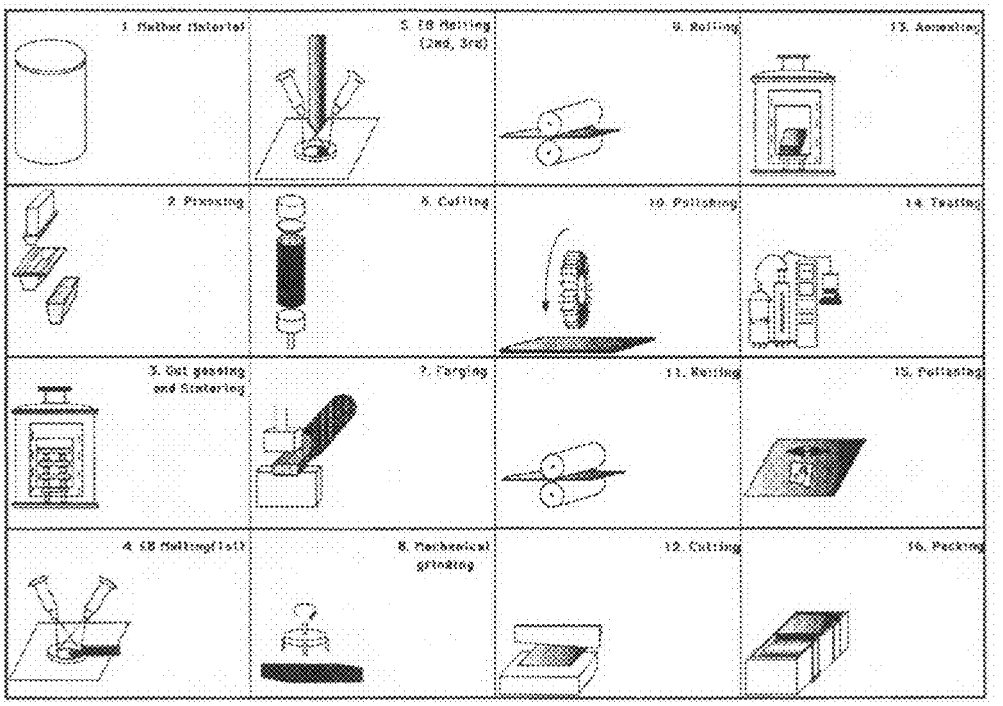
FIG. 1 is a diagram to explain manufacturing processes of a high-purity niobium plate material for a superconducting cavity.

2. With Respect to the Manufacturing Method of Niobium Materials for a Superconducting Radio-Frequency Cavity FIG. 1 is to explain manufacturing processes of a high-purity niobium plate material for a superconducting cavity. As shown in FIG. 1, starting with niobium powder or crude niobium ingot, the high-purity niobium material for a superconducting cavity undergoes complicated processes of vacuum electronic beam multi-melting of the ingot, forging, rolling, intermediate heat treatment and surface polishing. Further, this method generates a lot of waste materials in peeling off the forged product, and cutting disks from a rectangle plate, and the yield of the material is estimated at about 55%. Further, in the processes of rolling, etc. foreign substances are entangled from the environment, and reliability of the material may be lost. As a matter of course, it is inevitable to increase materials cost.

Meanwhile, conventionally, in development of the superconducting cavity of huge crystal niobium, the niobium ingot is sliced using a hard metal saw or electrical discharge machining. In the saw method, the yield of the material is poor due to the thickness (about 2 mm) of the used saw blade, and further, post-polishing is required because the sliced surface is rough. In the electrical discharge machining method, roughness of the sliced surface is acceptable, but development of a machine for concurrently slicing a large amount of plates is considered difficult for the reason in structure. These methods are not suitable for mass production, and much-anticipated is development of more efficient low-cost slicing methods.

The inventor of the invention solved such problems, and conceived a method for enabling significant cost reductions without impairing materials properties. Niobium plate materials were fabricated using a slicing machine for silicon ingots currently used in semiconductor techniques. In this method, since a round bar ingot with a required niobium disk diameter (270~265 mm in the ILC) is sliced using piano wires with a diameter of 0.16 mm and abrasive grains, it is possible to greatly reduce wastes of the material (approximately 15%, reduction to one-third as compared with the current method by forging and rolling). Further, since it is possible to eliminate all of the processes of forging, rolling and annealing, the material manufacturing processes are extremely simplified, productivity increases, and concurrently therewith, significant cost reductions are expected.

3. Slicing Process of the Niobium Ingot

In the invention, SiC floating grains of #800 (count) mixed into oil are sprayed to multiply-extended piano wires (diameter of 0.16 mm) from the side of slice section to be held by the wires, the wires with grains adhered thereto are moved, and the niobium ingot is friction-cut slowly while being pressed against from above.

In slicing, the top portion of the ingot is bonded to a support with an epoxy resin, and therefore, after cutting the ingot, the ingot is held by the support without coming apart. After finishing the cutting, the ingot is immersed in a release material, and the sliced plate is thereby removed from the support, and therefore, is not scratched. The cutting time was 38.9 hours. The cutting precision in the plate thickness was 50 μm that is two times higher than conventional precision of 100 μm. Roughness in the sliced surface was 3.5 μm except the center portion of the disk plate, while being 11.5 μm in the center portion. The center portion is holed in press processing, and therefore, the entire unused surface can be considered 3.5 μm. The need is eliminated for a post-finishing process to smooth surface roughness. Grains are contained in the surface and remain, but can be removed by light etching, and the clean surface is obtained. The used apparatus is E450-E-12H made by Toyo Advanced Technologies Co., Ltd. that is a machine capable of cutting a silicon ingot with maximum 300□ and 450 L. In slicing a niobium material with 270□ and 450 L, it is necessary to modify the support of the ingot to be stronger, but significant modification is considered unnecessary.

In addition, there is no experience of slicing a metal with a large diameter of about 300 mm using a silicon slicing machine in the semiconductor industry, and therefore, a lot of difficulties were expected in this method. It was pointed out that niobium is a metal having viscosity and that the plate material would be warped during slicing and cause the wires to tend to be cut. Further, with respect to wires for use in slicing, fixed grain wires with diamond baked thereto were first tried, but did not work on slicing of large-diameter metal. Further, even if it is possible to slice, the wire cost is expensive, and there is a concern that a single slice of niobium with 270□ costs million yen.

Then, back to the conventional floating abrasive grain method, a thick niobium plate with a thickness of 15 mm, width of 500 mm and length of 300 mm was tried and cut. Then, the slicing test proceeded using a niobium round bar with a diameter of 150 mm. A search for various conditions resulted in possibilities of large-diameter niobium ingot slice manufacturing. In these slicing tests, surface roughness ranging from 4 to 9 μm (Ry) was obtained. This surface roughness meets requirements for cavity manufacturing. Subsequently to the tests, the test shifted to tests of slicing an ingot with a diameter of 275 mm.

Meanwhile, conventionally, the niobium ingot with a diameter of 180 mm has been a standard, and in this experiment, an ingot with a large-diameter of 275 mm was fabricated as a prototype.

Figure 2:
FIG. 2 shows an example of a crucible for a niobium ingot with a diameter of 275 mm.
Figure 3:
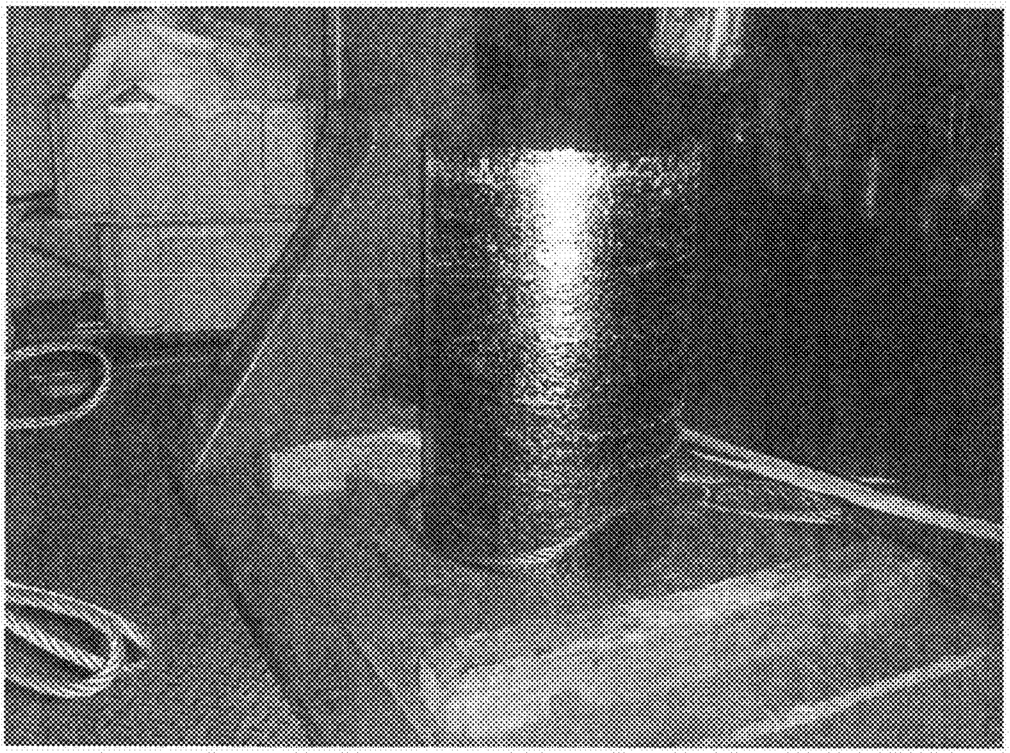
FIG. 3 shows an example of a fabricated ingot.

FIG. 2 shows a crucible for electronic beam melting fabricated for the ingot, and FIG. 3 shows the fabricated large-diameter ingot.

The ingot was fabricated by six-time multi-melting, and the RRR was 480. Then, two plates with a thickness of 20 mm were cut from the ingot using a saw, and slicing tests were performed.

Figure 4:
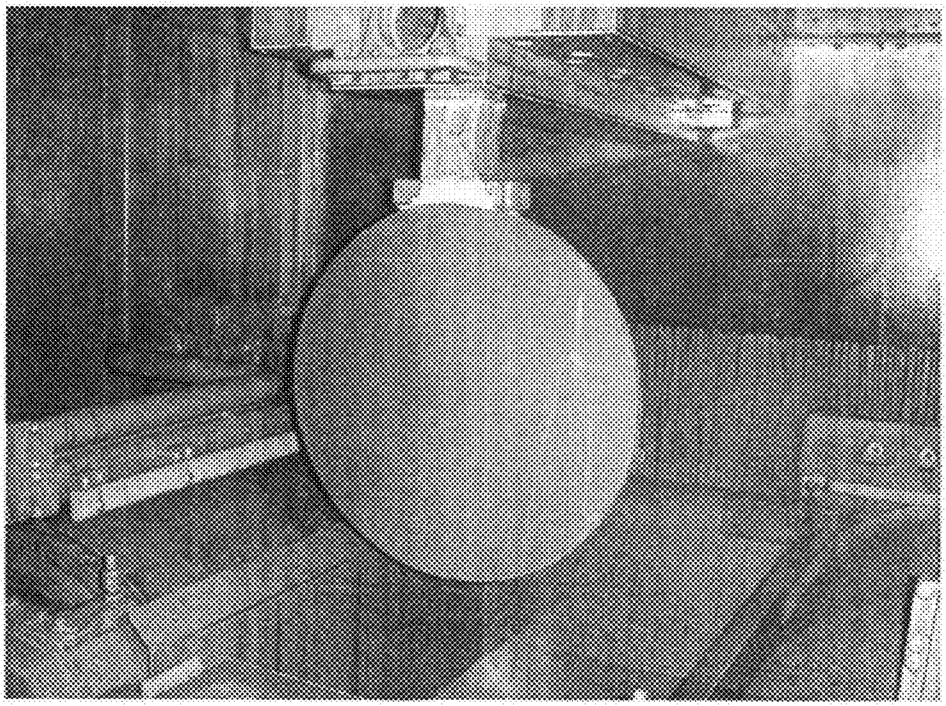
FIG. 4 is a photograph showing a slicing process of the niobium ingot.

FIG. 4 shows a state in which the plate with a thickness of 20 mm was set in the slicing apparatus. The top portion of the plate was fixed to the support of the slicing machine with an epoxy resin. Wires extended with a pitch of about 3 mm are in sight below the plate. The plate was pressed onto the wires moving at high speed to be sliced.

Figure 5:
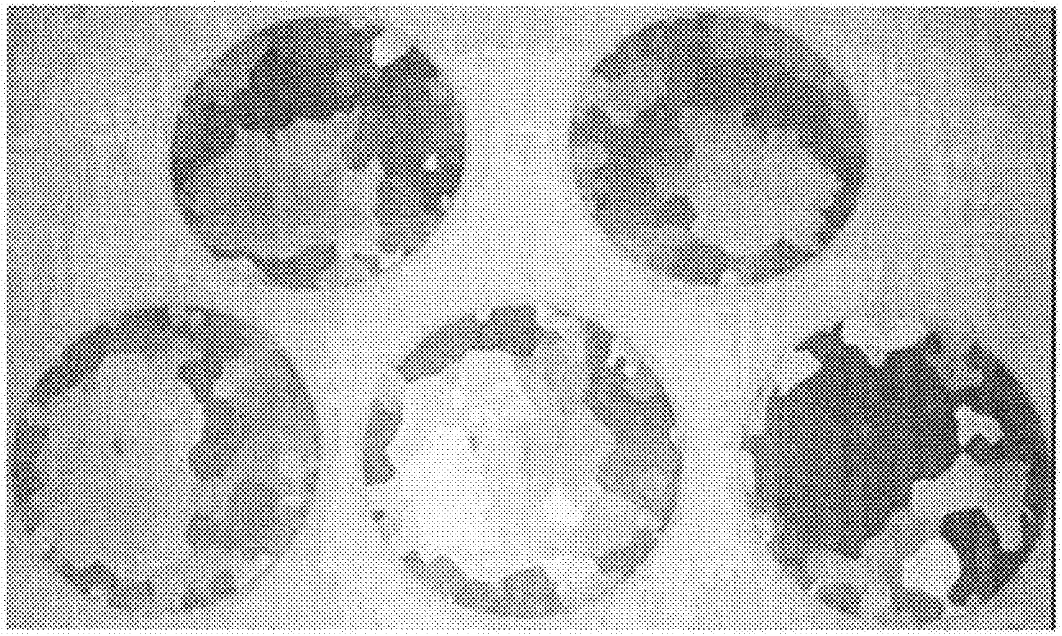
FIG. 5 shows an example of niobium disks of 2.8 t (subjected to etching by chemical polishing after slicing the surface) sliced from the niobium ingot with a thickness of 20 mm.

FIG. 5 shows sliced niobium plates. The surfaces were etched after being sliced, and therefore, large grain boundaries are clearly in sight. The plates were the so-called huge crystal niobium materials. Six plates were obtained in each of two slicing tests using the ingot with a thickness of 20 mm. Surface roughness ranging from 4 to 10 μm (Ry) was obtained. Polishing of sliced surfaces was not necessary. Further, precision of the plate thickness was 2.86±0.01 mm with respect to the target thickness of 2.80 mm, and it was found that the thickness precision is one digit higher than that in the conventional roll method. The slicing time was 40 to 48 hours. This time is the same as in the electrical discharge machining.

4. Fabricating Performance and Cavity Performance of Sliced Materials

Figure 6:
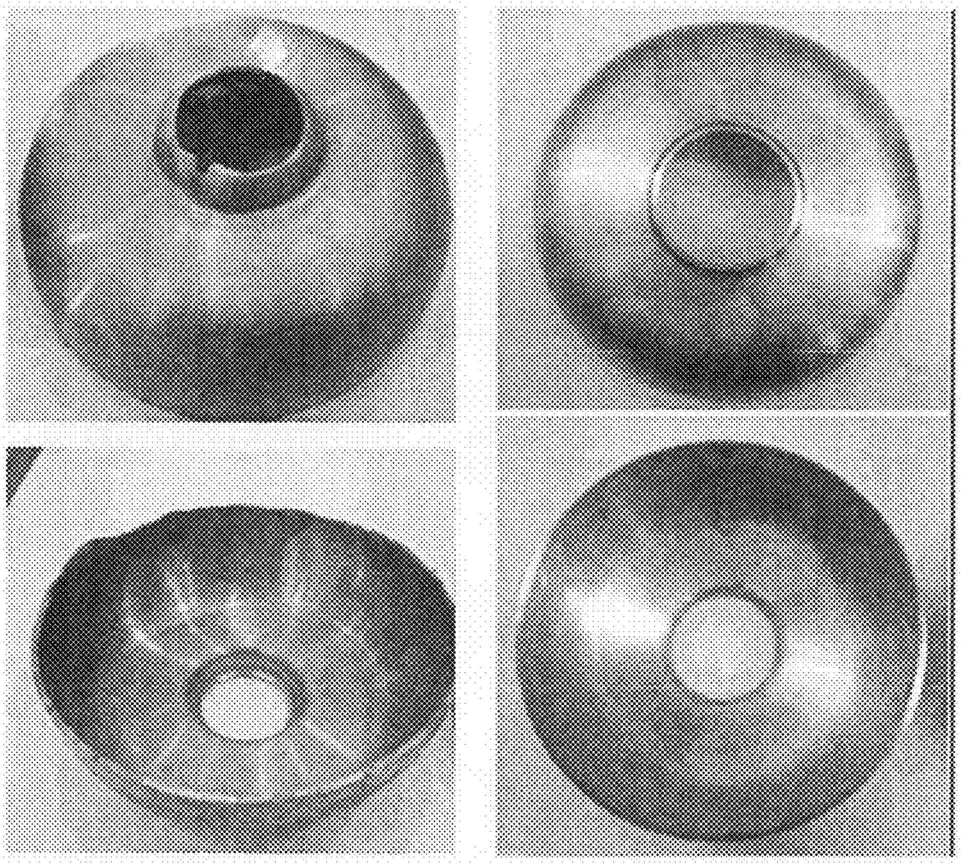
FIG. 6 shows an example of a half cup press-molded from the sliced material (left) and the half cut subjected to trimming processing (right)

FIG. 6 shows an example of a half cup press-molded from the sliced material (left) and the half cut subjected to trimming processing (right).

To evaluate the sliced niobium materials, an L-band single-cell cavity was fabricated from the plate materials (huge crystal) that were cut out using the first slicing test of the ingot with a thickness of 20 mm. The same method was used as the conventional method of fabricating a cavity using polycrystal niobium materials.

First, a sliced material with 270□ and 2.8 mm was pressed to fabricate a half cup of a cavity, and trimmed, and the cavity was completed by electronic beam welding. A crack developed in the center portion of the cup in press molding. However, the depth was of the degree such that the depth was removed by trimming processing, and did not have any problem in fabrication of the cavity. Further, the grain boundary sliding structure specific to huge crystal developed on the equator of the press cup, but was also removed by trimming processing. On the whole, it was confirmed that there is not any problem with cavity fabrication.

Figure 7:
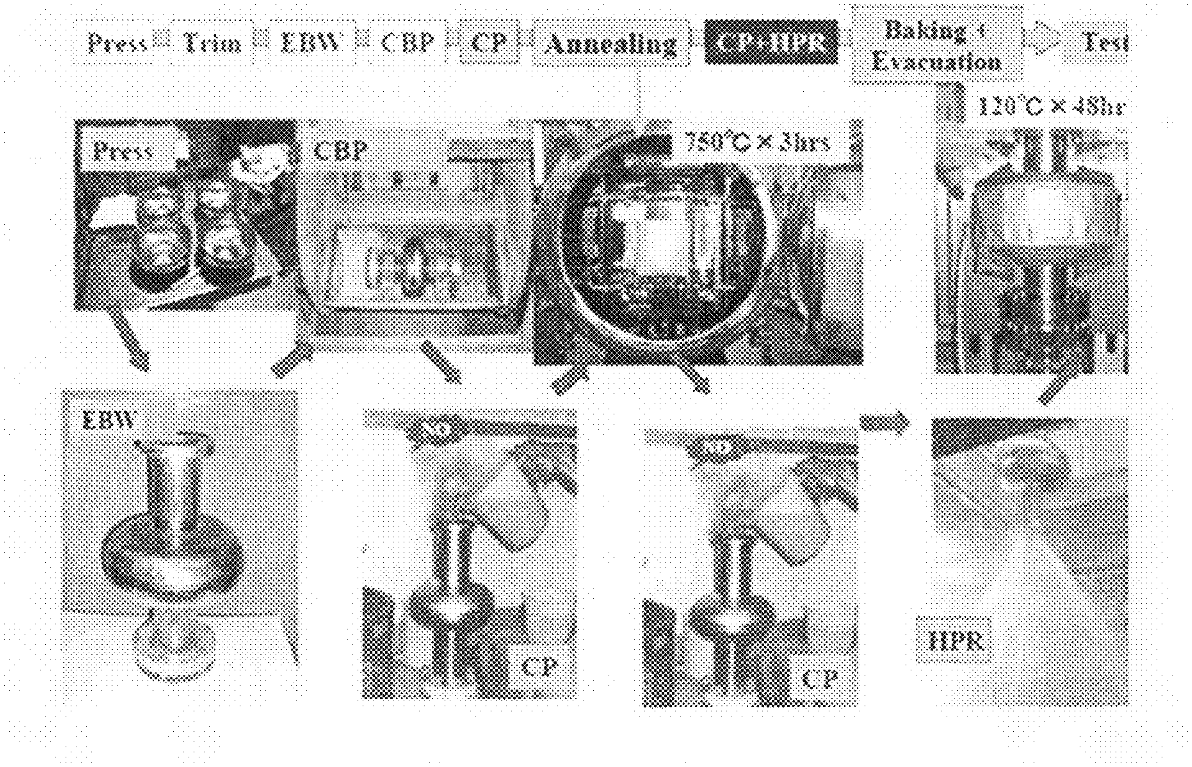
FIG. 7 shows a recipe used in cavity performance evaluations.
Figure 8:
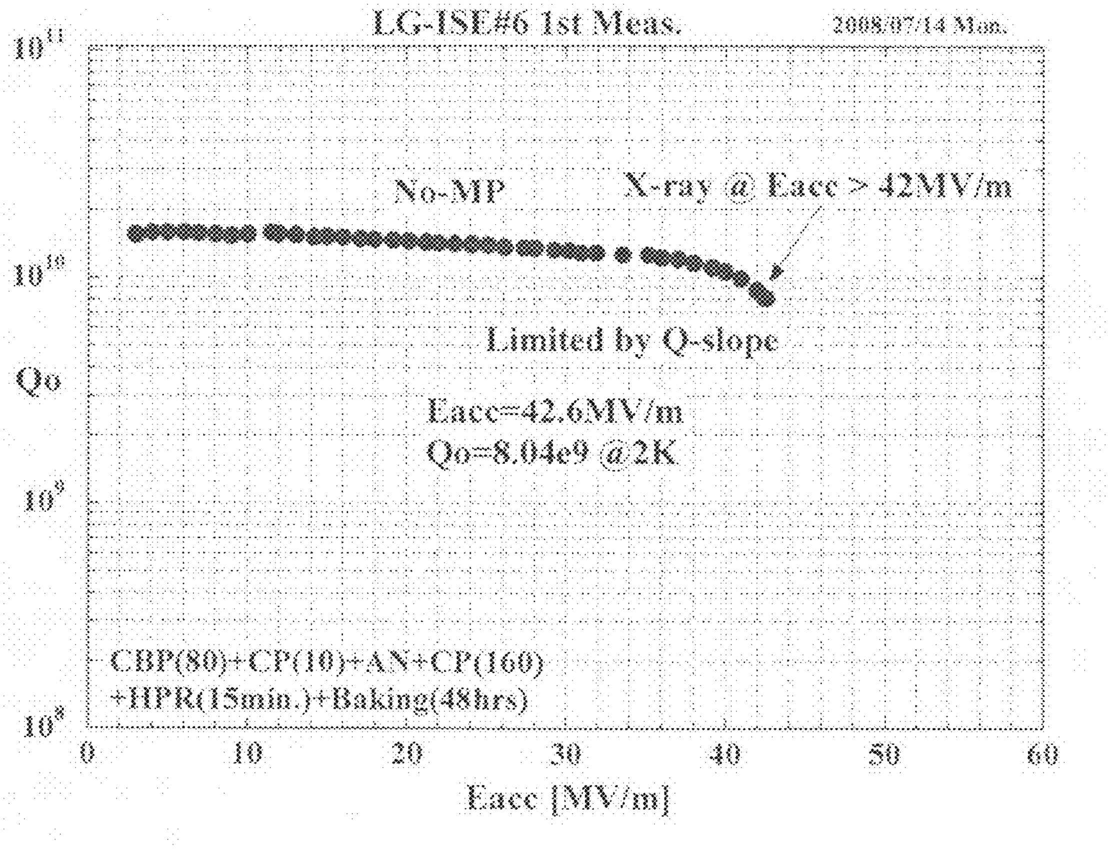
FIG. 8 shows performance test results of the L-band single cell cavity fabricated using the sliced materials.
Figure 9:
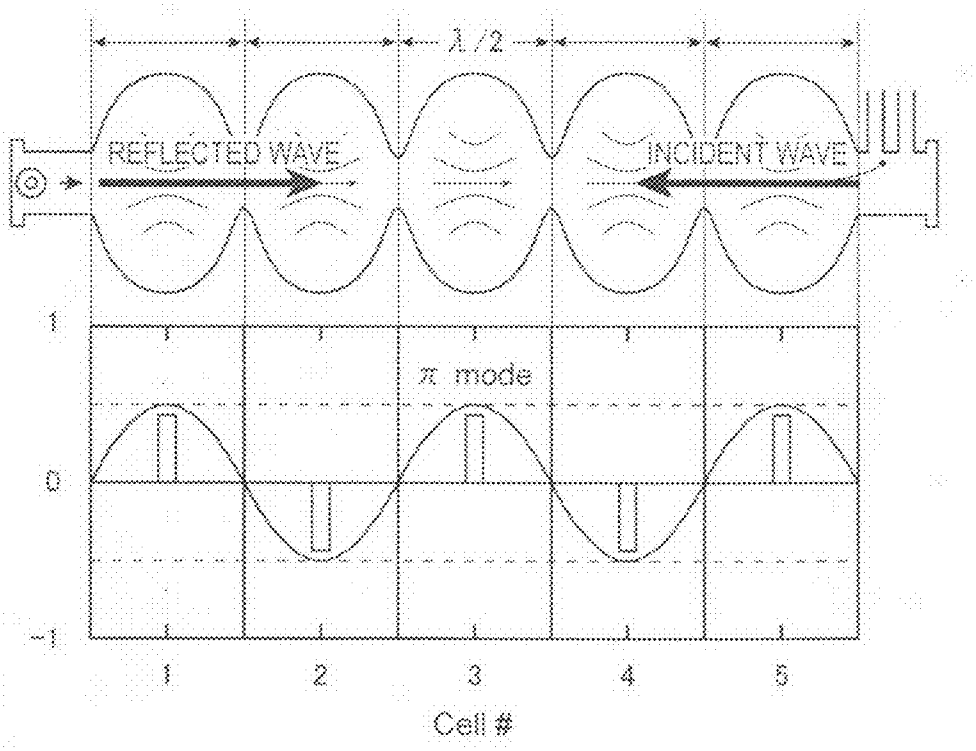
FIG. 9 is to explain the principle of accelerating the velocity of a charged particle in the radio-frequency acceleration cavity.

The completed cavity was subjected to surface treatment using the recipe as shown in FIG. 7. Herein, emphasized is the centrifugal barrel polishing process. The grain boundary step due to boundary grain sliding occurs in the surface inside the cavity in molding in the huge crystal material. Unless the grain boundary step is sufficiently smoothed by mechanical polishing such as centrifugal barrel polishing, enhancement in the RF magnetic field occurs when microwaves are applied in the cavity, and the acceleration electric field is limited. Further, only chemical polishing was applied this time. After mechanical polishing of about 80 μm by the centrifugal barrel, the surface stain layer due to the grains was removed by chemical polishing of 10 μm, hydrogen degassing annealing was performed, chemical polishing of 160 μm was subsequently performed, high-pressure rinsing was performed for 15 minutes using pure water, and the cavity was assembled and baked at 120° C. for 48 hours. As shown in FIG. 8, 42.6 MV/m was achieved by a series of these first tests. It is possible to obtain cavity performance adequately meeting the target performance of the ILC using sliced materials.

5. With Respect to the Effect of Cost Reductions in Mass Production and the Ripple Effect It is anticipated that it is possible to slice into 150 plates with a thickness of 2.8 mm for 48 hours from a single ingot with 270□ and 450 L that was fabricated as a prototype this time. For the ILC, the reduction amount in costs by this method was estimated. Assuming daily production of 420 plates for three years, the number of required slicing machines is "8" including a reserve machine. The slicing cost is about five thousand yen including the capital cost, consumable items expected from the tests this time, labor costs and percentage of profit. This method provides the niobium ingot price plus five thousand yen, and enables reductions in the materials cost by half to be expected. In the ILC, the cost reduction of 15 billion yen is expected.

For example, slicing of the niobium ingot is applicable to fabrication of an X-band copper cavity. Further, not being limited to metals, the slicing is applicable to ceramic plate materials of RF window. In the future, depletion of various rare resources is feared, and this method enables materials to be obtained with few waste materials.

As specifically described above, the manufacturing method of a superconducting radio-frequency acceleration cavity has each of the steps of (a) obtaining an ingot made from a disk-shaped niobium material, (b) slicing and cutting the niobium ingot into a plurality of niobium plates each with a predetermined thickness, by vibrating multiple wires back and forth while spraying fine floating abrasive grains with the niobium ingot supported, (c) removing the floating abrasive grains adhered to the sliced niobium plates, and (d) performing deep draw forming on the niobium plates and thereby forming a niobium cell of a desired shape.

By this means, for example, it is possible to fabricate 146 sheets of niobium plate material of 2.8 t for 39 hours. Further, a single machine is capable of slicing 155 ingots a year. Surface roughness of the sliced surface is 10 μm or less, and particularly, the need for the surface finishing process is eliminated. This method enables the cost of niobium cell materials (310,000 sheets) required for the ILC to be reduced to about a half of the current market price per sheet, and the cost reduction of total 15 billion yen is expected. Further, it was verified that there are not any significant problems with half-cell formability (press) of the niobium plate material fabricated in this method.

Industrial Applicability

The present invention relates to a radio-frequency acceleration cavity used in a charged particle accelerator such as a synchrotron, and more particularly, to a manufacturing method of a superconducting radio-frequency acceleration cavity, and has industrial applicability.

The invention claimed is:

1. A method of manufacturing a superconducting radio-frequency acceleration cavity used in a charged particle accelerator, comprising the steps of:

(a) obtaining an ingot made from a disk-shaped niobium material;

(b) slicing and cutting the niobium ingot into a plurality of niobium plates each with a predetermined thickness, by vibrating multiple wires back and forth while spraying fine floating abrasive grains with the niobium ingot supported, wherein a top portion of the niobium ingot is bonded and supported with a resin when slicing and cutting the niobium ingot, thereby obtaining a plurality of sliced niobium plates, and immersing the plurality of sliced niobium plates in a release material;

(c) removing the floating abrasive grains adhered to surfaces of the plurality of sliced niobium plates after immersing the plurality of sliced niobium plates in the release material;

(d) performing deep draw forming on each of the plurality of sliced niobium plates and thereby forming a niobium cell of a desired shape and obtaining a cavity;

(e) performing hydrogen degassing annealing of the cavity after removing a surface stain layer of the cavity; and (f) baking the cavity which is assembled with the plurality of sliced niobium plates.

2. The method of manufacturing a superconducting radio-frequency acceleration cavity according to claim 1, wherein the niobium ingot is niobium alone or alloys with other metals.

3. The method of manufacturing a superconducting radio-frequency acceleration cavity according to claim 1, wherein in the step (a), the disk-shaped niobium ingot is obtained by applying electronic beams to a niobium material in a crucible of a predetermined shape to melt.

4. The method of manufacturing a superconducting radio-frequency acceleration cavity according to claim 2, wherein the floating abrasive grains are silicon carbide (SiC) mixed into oil.

5. The method of manufacturing a superconducting radio-frequency acceleration cavity according to claim 2, wherein in the step (b) of slicing and cutting the niobium ingot, the top portion of the niobium ingot is bonded and supported with an epoxy resin.

6. The method of manufacturing a superconducting radio-frequency acceleration cavity according to claim 2, wherein each of the wires used in the step (b) is a piano wire with a diameter of 0.16 mm.

7. The method of manufacturing a superconducting radio-frequency acceleration cavity according to claim 2, wherein the step of removing the floating abrasive grains in the step (c) is etching.

8. The method of manufacturing a superconducting radio-frequency acceleration cavity according to claim 2, wherein when a thickness of the niobium ingot is 20 mm, six niobium plates are obtained.

9. The method of manufacturing a superconducting radio-frequency acceleration cavity according to claim 2, further comprising centrifugal barrel polishing of the cavity before the hydrogen degassing annealing of the cavity.

10. The method of manufacturing a superconducting radio-frequency acceleration cavity according to claim 2, further comprising chemical polishing of the cavity to remove the surface stain layer of the cavity before the hydrogen degassing annealing of the cavity.

11. The method of manufacturing a superconducting radio-frequency acceleration cavity according to claim 10, further comprising another chemical polishing of the cavity before the baking of the cavity.

12. The method of manufacturing a superconducting radio-frequency acceleration cavity according to claim 11, further comprising high-pressure rinsing of the cavity with pure water before the baking of the cavity.

* * * * *